(12) United States Patent
Ishiyama

(10) Patent No.: US 8,236,674 B2
(45) Date of Patent: Aug. 7, 2012

(54) SUBSTRATE PROCESSING METHOD AND SEMICONDUCTOR DEVICE MANUFACTURING METHOD INCLUDING A PROTON INJECTION STEP AND A LASER IRRADIATION STEP

(75) Inventor: Shintaro Ishiyama, Ibaraki (JP)

(73) Assignee: Japan Atomic Energy Agency, Ibaraki (JP)

( * ) Notice: Subject to any disclaimer, the term of this patent is extended or adjusted under 35 U.S.C. 154(b) by 0 days.

(21) Appl. No.: 12/926,026

(22) Filed: Oct. 21, 2010

(65) Prior Publication Data

US 2011/0130013 A1 Jun. 2, 2011

(30) Foreign Application Priority Data

Oct. 23, 2009 (JP) ................ 2009-244603

(51) Int. Cl.
*H01L 21/425* (2006.01)
*H01L 21/44* (2006.01)
*H01L 21/26* (2006.01)
(52) U.S. Cl. ......... 438/514; 438/676; 438/792; 438/795
(58) Field of Classification Search .................. 438/514, 438/676, 792, 795; 257/E21.248
See application file for complete search history.

(56) References Cited

U.S. PATENT DOCUMENTS

| 6,486,008 B1 | 11/2002 | Lee | |
|---|---|---|---|
| 2006/0234486 A1* | 10/2006 | Speck et al. | 438/590 |
| 2007/0218608 A1* | 9/2007 | Tanaka | 438/166 |

FOREIGN PATENT DOCUMENTS

| JP | 3048201 | 3/2000 |
|---|---|---|
| JP | 2002-222772 | 8/2002 |

OTHER PUBLICATIONS

Makoto Yoshimi et al.; SOI; Electronic Materials; Apr. 2007; pp. 37-43.
Kimikazu Moritani et al.; Production and Reaction Kinetics for Radiation-Induced Defects in α-Alumina and Sapphire Under Ion Beam Irradiation; Journal of Nuclear Materials; 2008; pp. 157-163; vol. 373; Elsevier B.V.
Kimikazu Moritani et al.; Production Behavior of Irradiation Defects in α-Alumina and Sapphire Under Ion Beam Irradiation; Journal of Nuclear Materials; 2004; pp. 106-113; vol. 326; Elsevier B.V.
T. Mohanty et al.; Color Center Formation in Sapphire by Swift Heavy Ion Irradiation; Radiation Measurements; 2003; pp. 723-272; vol. 36; Elsevier Ltd.

(Continued)

*Primary Examiner* — William M. Brewster
(74) *Attorney, Agent, or Firm* — Paul F. Neils, Esq.; Edwards Neils PLLC

(57) ABSTRACT

A substrate micro-processing method and a semiconductor device manufacturing method in which a stained part does not remain in a finished product even if a residual ion-injected part stays in the finished product. The substrate micro-processing method is one that carries out processing of a substrate by dividing the substrate depthwise, and comprises a proton injection step S11 in which protons are injected from one principal surface side of the substrate and an irradiation step S12 in which the substrate is irradiated with light having the wavelength nearly equal to the absorption wavelength of the defect level formed within the substrate due to the proton injection in order to divide the substrate.

5 Claims, 19 Drawing Sheets

OTHER PUBLICATIONS

Yufeng Song et al.; Color Center Formation in α-Al2O3 Induced by High Energy Heavy Ions; Nuclear Instruments and Methods in Physics Research B; 2007; pp. 268-272; vol. 254; Elsevier B.V.

K. H. Lee et al.; Luminescence of the F Center in Sapphire; Physical Review B; Mar. 15, 1979; pp. 3217-3221; vol. 19, No. 6; The American Physical Society.

V.N. Gurarie et al.; Ramen-Based Analysis of Implantation-Induced Expansion and Stresses in Sapphire Crystals; May 2005; pp. 1131-1138; vol. 20, No. 5; Materials Research Socie.

Chengyong Jiang et al.; Femtosecond Laser Irradiation on YAG and Sapphire Crystals; 2004; pp. 181-185; vol. 260; Elsevier B.V.

Saulius Juodkazis et al.; In-Bulk and Surface Structuring of Sapphire by Femtosecond Pulses; Applied Surface Science; 2007; pp. 6539-6544; vol. 253; Elsevier B.V.

X. C. Wang; Femtosecond Pulse Laser Ablation of Sapphire in Ambient Air; Applied Surface Science; 2004; pp. 221-226; vol. 228; Elsevier B.V.

\* cited by examiner

| Sample No. | Axis | Ion | Temperature (K) | Machine | Energy(MeV) | Dose (/cm²) | Conditions |
|---|---|---|---|---|---|---|---|
| 11-1 | c | H⁺ | RT | Ion injection | 0.3 | $1 \times 10^{18}$ | |
| 11-2 | c | H⁺ | | | | $2 \times 10^{17}$ | X |
| 11-3 | c | H⁺ | | | | $2 \times 10^{17}$ | |
| 11-4 | a | H⁺ | | | | $2 \times 10^{16}$ | O |
| 11-5 | c | H⁺ | | | | $4 \times 10^{17}$ | X |
| 11-6 | c | H⁺ | | | | $7 \times 10^{16}$ | |
| 12-1 | a | H₂⁺ | | | | | |
| 12-2 | c | H₂⁺ | | | | | |
| 12-3 | a | H₂⁺ | | | | $5 \times 10^{16}$ | O |
| 12-4 | c | H₂⁺ | | | | | |
| 12-5 | a | H₂⁺ | | | | | |
| 12-6 | c | H₂⁺ | | | | | |
| 12-7 | a | H₂⁺ | | | | | |
| 12-8 | c | H₂⁺ | | | | $3 \times 10^{16}$ | |
| 12-9 | c | H₂⁺ | | | | | |
| 12-10 | a | H₂⁺ | | | | | |

FIG. 5

| Sample No. | Axis | Ion | Temperature (K) | Machine | Energy(MeV) | Dose (/cm²) | Conditions |
|---|---|---|---|---|---|---|---|
| 12-11 | c | $H_2^+$ | RT | Ion injection | 0.3 | $2 \times 10^{16}$ | ○ |
| 12-12 | a | | | | | $1 \times 10^{17}$ | |
| 12-13 | c | | | | | $1.3 \times 10^{17}$ | |
| 12-14 | a | | | | | $7 \times 10^{16}$ | |
| 12-15 | c | | | | | $5 \times 10^{16}$ | |
| 12-16 | a | | | | | $3 \times 10^{16}$ | |
| 12-17 | c | | | | | $1 \times 10^{17}$ | |
| 12-18 | a | | | | | $1.3 \times 10^{17}$ | |
| 12-19 | c | | | | | $2 \times 10^{17}$ | |
| 12-20 | a | | | | | $2 \times 10^{16}$ | |
| 12-21 | c | | 110K | | | | |
| 12-22 | a | | | | | | |
| 12-23 | c | | | | | | |
| 12-24 | a | | | | | | |
| 12-25 | c | | | | | | |
| 12-26 | a | | | | | | |
| 12-27 | c | | | | | | |
| 12-28 | a | | | | | | |
| 12-29 | c | | | | | | |
| 12-30 | a | | | | | | |
| 12-31 | c | | | | | | |
| 12-32 | a | | | | | | |

FIG. 6

| Sample No. | Axis | Ion | Temperature (K) | Machine | Energy(MeV) | Dose (/cm²) | Conditions |
|---|---|---|---|---|---|---|---|
| 13-1 | a | $H_2^+$ | RT | Ion injection | 0.3 | $1.5 \times 10^{17}$ | ○ |
| 13-2 | c | | | | | $2 \times 10^{17}$ | × |
| 13-3 | c | | | | | $3 \times 10^{17}$ | |
| 13-4 | c | | | | | $1 \times 10^{17}$ | ○ |
| 13-5 | c | | | | | $2.5 \times 10^{17}$ | |
| 13-6 | c | | | | | $1.5 \times 10^{17}$ | |
| 13-7 | c | | | | | $1.3 \times 10^{17}$ | × |
| 13-8 | c | | | | | | |
| 13-9 | c | | | | | $1.2 \times 10^{17}$ | |
| 13-10 | c | | | | | | |
| 13-11 | c | | | | | | |
| 13-12 | c | | | | | $1 \times 10^{17}$ | ○ |
| 13-13 | c | | | | | | |
| 13-14 | c | | | | | | |
| 13-15 | c | | | | | | |
| S1-1 | c | $H^+$ | RT | Single end | 3 | $5 \times 10^{16}$ | ○ |
| S1-2 | c | | | | | | |
| S1-3 | a | | | | | | |
| S1-4 | c | | | | | | |
| S2-1 | a | | | | | $7.5 \times 10^{16}$ | |
| S2-2 | c | | | | | | |
| S2-3 | a | | | | | $2.5 \times 10^{16}$ | |
| S2-4 | c | | | | | | |
| S3-1 | c | | | | | $1 \times 10^{17}$ | |
| S3-2 | c | | | | | | |

FIG. 7

SUBSTRATE PROCESSING METHOD AND SEMICONDUCTOR DEVICE MANUFACTURING METHOD INCLUDING A PROTON INJECTION STEP AND A LASER IRRADIATION STEP

CROSS-REFERENCE TO RELATED APPLICATIONS

The present application claims priority from Japanese Patent Application No. 2009-244603, filed Oct. 23, 2009, the contents of which are herein incorporated by reference in their entirety.

BACKGROUND OF THE INVENTION

The present invention relates to a substrate processing method and a semiconductor device manufacturing method, and in particular to a substrate processing method and a semiconductor device manufacturing method that employ a proton injection process and a laser irradiation process.

In the case of a conventional white LED product, a blue light emitting diode GaN is made grow on the surface of an ultraprecision-processed sapphire substrate (alumina oxide) that is cheap and can easily cause epitaxial growth, and then an LED device is obtained by layering a white conversion device (such as Ce) on GaN in order to obtain white light. In the future, to lower the price of LED products, it is effective to use a technique of producing thin film of sapphire single crystal, which is then used as a substrate for GaN deposition.

Further, if a circuit could be formed on a semiconductor substrate of cheap sapphire by microfabrication process, then a masking process and a subsequent corrosion working process could be omitted. This will largely contribute to cost reduction in manufacturing a semiconductor device.

As a method of producing a thin film of sapphire, it might be possible to consider applying a method that carries out the smart cut process by injecting protons into Si semiconductor and applying heat to it (See Non-Patent Document 1 and Patent Document 1). Until now, however, there is no example that has applied this method to sapphire as an alumina oxide in order to carry out a thin film producing process and a microfabrication process. There are past reports of various tests of ion injection and laser irradiation of sapphire. The former, however, was carried out mainly for studying color centers generated by ion injection (See Non-Patent Documents 2-7), and the latter for studying damage due to laser irradiation (See Non-Patent Documents 8-10). There is no example that combines these techniques in order to carry out a microfabrication process and a thin film producing process for sapphire itself.

Patent Documents 2 and 3 disclose methods of preparing a nitride semiconductor substrate. In these methods, atomic bonds within a substrate are weakened by ion injection or the like, and nitride semiconductor is made grow on the substrate, and then the substrate and the nitride semiconductor are separated by laser irradiation.

PRIOR ARTS

Patent Documents

Patent Document 1: Japanese Patent No. 3048201;
Patent Document 2: Japanese Un-examined Patent Application Laid-Open No. 2002-222772; and
Patent Document 3: U.S. Pat. No. 6,486,008B1.

Non-Patent Documents

Non-Patent Document 1: Shin, Yoshimi, Denshi Zairyo (Electronic Materials), pp. 37-43 (2007);
Non-Patent Document 2: K. Moritani, Y. Teraoka, I. Takagi and et al., J. of Nuclear Mater. 373 (2008) 157-163;
Non-Patent Document 3: K. Moritani, I. Takagi and H. Moriyama, J. of Nuclear Mater. 326 (2004) 106-113;
Non-Patent Document 4: T. Mohanty, N. C. Mishra, F. Shingh and et al., Radiation Measurement 36 (2003) 723-727;
Non-Patent Document 5: Y. Song, Q. Lui, Y. Sun and et al., Nuclear Instruments and Methods in Physics Research B 254 (2007) 268-272;
Non-Patent Document 6: K. H. Lee and J. H. Crawford Jr., Physical Review B Vol. 19, No. 6, 3217-3221 (1979);
Non-Patent Document 7: V. N. Gurarie, P. H. Otsuka, D. N. Jamieson and S. Prawer, J. Mater. Res. Vol. 20, No. 5, 1131-1138 (2005);
Non-Patent Document 8: C. Jiang, G. Zhou, J. Xu and et al., J. of Crystal Growth 260 (2004) 181-185;
Non-Patent Document 9: S. Juodkazis, K. Nishimura and H. Misawa, Applied Surface Science 253 (2007) 6539-6544; and
Non-Patent Document 10: X. C. Wang, G. C. Lim, H. Y. Zheng and et al., Applied Surface Science 228 (2004) 221-226.

SUMMARY OF THE INVENTION

Patent Documents 2 and 3 disclose not a method of processing a substrate itself, but a method of depositing semiconductor or the like on a substrate and then separating it from the substrate. Further, single crystalline sapphire has directions of specific crystal orientations along which it is susceptible to fracture. Thus, the conventional processing method can cause a nick or damage. Further, a sapphire substrate is a super hard and cutting-resistant material, and thus it is very difficult to carry out microfabrication process and thin film producing process.

Considering these problems, an object of the present invention is to provide a substrate processing method and a semiconductor device manufacturing method that can easily carry out a microfabrication process and a thin film producing process for a substrate.

To achieve the above object, the substrate processing method and the semiconductor manufacturing method according to the present invention are composed as follows.

A first substrate processing method is a substrate processing method that processes a substrate by dividing the substrate depthwise and comprises: a proton injection step, in which protons are injected from one principal surface side of the substrate; and an irradiation step, in which the substrate is irradiated with light having a wavelength nearly equal to an absorption wavelength of a defect level formed within the substrate due to proton injection in order to divide the substrate.

A second substrate processing method is characterized in that, in the above method, the substrate is preferably made of sapphire.

A third substrate processing method is characterized in that, in the above method, a proton dose in the proton injection step is preferably more than or equal to $1.0*10^{16}$ (/cm$^2$) and less than or equal to $1.0*10^{17}$ (/cm$^2$).

A fourth substrate processing method is characterized in that, in the above method, a proton dose in the proton injection step is preferably more than or equal to $1.0*10^{16}$ (/cm$^2$) and less than or equal to $1.0*10^{17}$ (/cm$^2$).

A fifth substrate processing method is characterized in that, in the above method, energy of proton injection in the proton injection step is preferably more than or equal to 0.2 MeV and less than or equal to 10 MeV.

A sixth substrate processing method is characterized in that, in the above method, energy of proton injection in the proton injection step is preferably more than or equal to 0.2 MeV and less than or equal to 10 MeV.

A seventh substrate processing method is characterized in that, in the above method, energy of proton injection in the proton injection step is preferably more than or equal to 0.2 MeV and less than or equal to 10 MeV.

A eighth substrate processing method is characterized in that, in the above method, energy of proton injection in the proton injection step is preferably more than or equal to 0.2 MeV and less than or equal to 10 MeV.

A first semiconductor manufacturing method is characterized in that: one of the above first through fourth substrate processing methods is used to manufacture a semiconductor device having a semiconductor layer formed on a substrate; and the semiconductor layer is formed on a principal surface of the substrate after the proton injection step, and thereafter the irradiation step is carried out.

According to the present invention, it is possible to provide a substrate processing method and a semiconductor device manufacturing method that can easily carry out a microfabrication process and a thin film producing process for a substrate.

BRIEF DESCRIPTION OF THE DRAWINGS

FIG. 5 is a table showing injection conditions, doses of protons and states of sapphire after injection in a case where protons were injected into sapphire single crystal with respective injection energies by using two types of accelerators (i.e. an ion injection system and a single-end accelerator);

FIG. 6 is a table showing injection conditions, doses of protons and states of sapphire after injection in a case where protons were injected into sapphire single crystal with respective injection energies by using two types of accelerators (i.e. an ion injection system and a single-end accelerator);

FIG. 7 is a table showing injection conditions, doses of protons and states of sapphire after injection in a case where protons were injected into sapphire single crystal with respective injection energies by using two types of accelerators (i.e. an ion injection system and a single-end accelerator);

DETAILED DESCRIPTION

Now, preferred embodiments (examples) of the present invention will be described referring to the attached drawings.

As a first characteristic, the present invention is based on detection that injection of protons into a sapphire substrate causes generation of point defects (color centers) (which absorb ultraviolet of wavelength of 200 nm) in a laminated state within the sapphire substrate at depths of several μ to several tens μm from the irradiated surface depending on injection energy. Further, as a second characteristic, the present invention notices the absorption of the specific wavelength by the above-mentioned point defect region in the sapphire substrate generated by proton injection and applies this in processing of the sapphire substrate. That is to say, laser beam of the above-mentioned absorption wavelength is irradiated by an ArF excimer laser from the outside of the proton-injected sapphire substrate so that laser irradiation energy is efficiently absorbed by the point defects generated in the proton-injected sapphire substrate. Then, by raising the internal temperature of the absorption region, the internal pressure of $H_2$ molecules immobilized within the point defects is raised, to cause expansion. As a result, internal stress generated in the sapphire owing to the expansion caused by the raise of the internal pressure becomes larger than the mechanical strength of the sapphire itself. Thus, in the case where the depth of the proton injection is shallow (about 1 μm) from the injection surface, this causes delamination by generation of bridging on the irradiated surface in a plane stress condition, and thus it is possible to carry out surface delamination processing along the laser irradiation area. Further, in the case where the proton injection is deep (about several tens μm), it is possible to produce a delaminated film corresponding to the injection depth when a crack extends in the direction of the proton injection surface at the location of the point defects under raised internal pressure in a plane stress condition.

Figure 1:
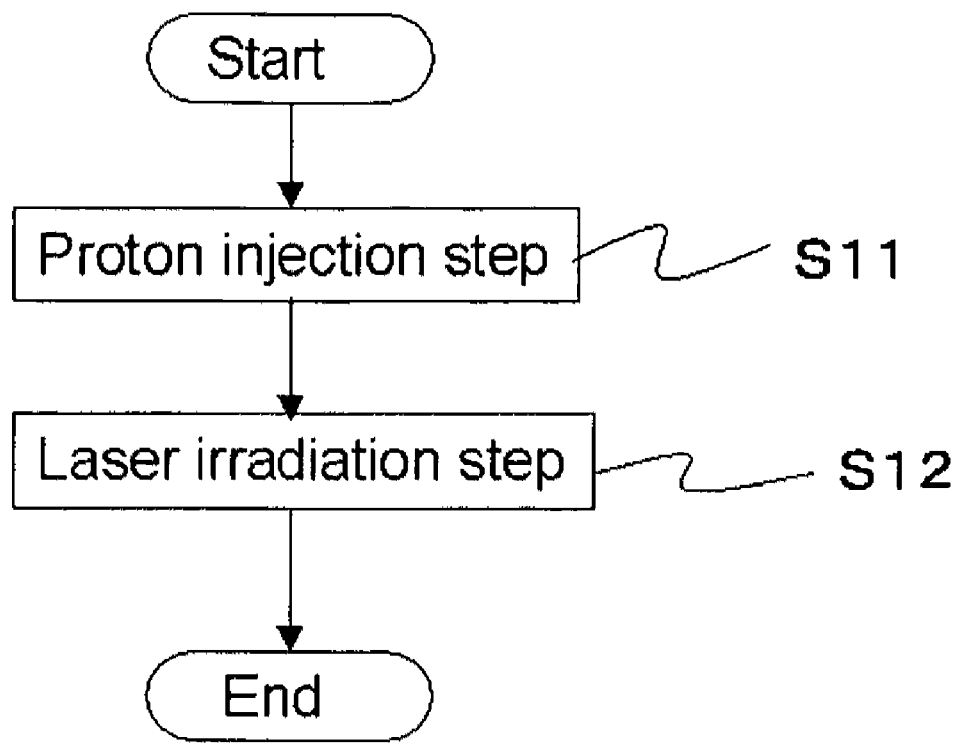
FIG. 1 is a flowchart showing steps of processing a substrate by a substrate processing method according to a first embodiment of the present invention.

FIG. 1 is a flowchart showing steps of processing a substrate by a substrate processing method of a first embodiment of the present invention. The substrate processing steps comprise a proton injection step (S11) and a laser irradiation step (S12).

In the proton injection step (S11), a substrate is prepared and protons are injected from one principal surface side of the substrate to form a region where point defects (color centers) have been generated. In the laser irradiation step (S12), the substrate is divided by irradiating it with light of the wavelength nearly equal to the absorption wavelength of the defect level formed within it due to the proton injection. That is to say, in the laser irradiation step, laser beam corresponding to the absorption wavelength of the point defects generated by the proton injection is irradiated to raise the internal temperature of the region of the generated point defects, and thus delamination or a groove is formed from the raised-temperature part. Then, the substrate is divided depthwise to finish the processing.

Figure 2:
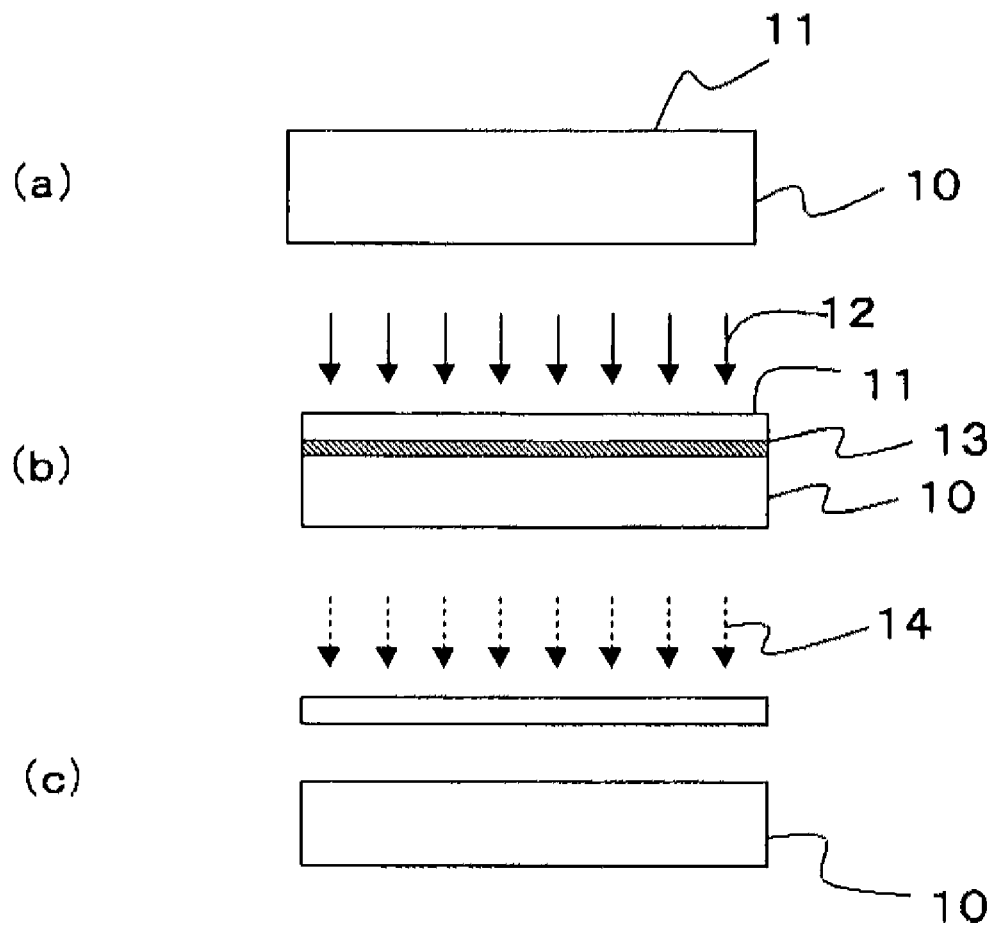
FIG. 2 is cross section showing a substrate in each substrate processing step of the substrate processing method of the first embodiment of the present invention.

The substrate processing steps are carried out as follows. FIG. 2 is a cross section showing a substrate in each step of the substrate processing steps. In FIG. 2(a), a sapphire substrate 10 is a substrate of sapphire (single crystal of aluminum oxide) having a diameter of 2 inches and a thickness of 700 microns, with its front and back sides being mirror surfaces. The plane direction of the front side is a (0001) plane. Next, in FIG. 2(b), protons (H) are injected from one principal surface side 11 by an accelerator or an ion injection system (not shown) (this is shown by the arrow 12 in the figure). This results in formation of a point defect generation region 13.

The sapphire substrate 10 was placed on a specimen platform of the accelerator or ion injection system to perform this proton injection step. To avoid blistering, the injection dose of protons is preferably less than or equal to $1.0*10^{17}$ (ion/cm$^2$), and more preferably more than or equal to $1.0*10^{16}$ (ion/cm$^2$) and less than or equal to $1.0*10^{17}$ (ion/cm$^2$). Further, to reduce damage in the neighborhood of the surface of the sapphire, energy of the proton injection is preferably less than or equal to 10 MeV, and more preferably more than or equal to 0.2 MeV and less than or equal to 10 MeV. The proton injection was performed in a state that the sapphire substrate 10 was tilted at a suitable angle, for example 5°. By injecting protons into the sapphire substrate 10, point defects (color centers), which absorbed ultraviolet of the wavelength of 200 nm, were generated in a laminated state within the sapphire substrate at depths of several μ-several tens μm from the irradiated surface depending on the injection energy.

Here, as for the injection angle at the time of the proton injection, it is preferable that ions are incident from a plane that is tilted at 2° or more to the (0001) plane in order to prevent deep injection of protons owing to the channeling effect.

In the laser irradiation step (S12), for example as shown in FIG. 2(c), laser beam (shown by the dotted arrow 14 in the figure) is irradiated from the surface of the sapphire substrate 10. As a result, laser irradiation energy is efficiently absorbed in the point defect generation region 13 generated by the proton injection. Then, the internal temperature of the absorption region rises and the internal pressure of $H_2$ molecules immobilized within the point defects rises, to cause expansion. As a result, internal stress generated in the sapphire owing to the expansion caused by the raise of the internal pressure becomes larger than the mechanical strength of the sapphire itself. Thus, in the case where the depth of the proton injection is shallow (about 1 μm) from the injection surface, this causes delamination by generation of bridging on the irradiated surface in a plane stress condition, and thus it is possible to carry out surface delamination processing along the laser irradiation area. Further, in the case where the proton injection is deep (about several tens μm), it is possible to produce a delaminated film corresponding to the injection depth when a crack extends in the direction of the proton injection surface at the location of the point defects under raised internal pressure in a plane stress condition.

In this laser irradiation step, the proton-injected sapphire substrate 10 is set in a fixture; and this sapphire substrate 10 is irradiated with laser beam of about 200 nm by an ArF (193 nm) excimer laser. As a result, the laser beam is absorbed by the color centers formed by the proton injection; the temperature of the layer of the color centers is raised; hydrogen molecules expand; that area comes to have internal stress and to be delaminated; and a groove is formed, to finish the processing of the sapphire substrate.

In this way, it is possible to perform a microfabrication process and a thin film producing process of a sapphire substrate easily. Further, proton irradiation generates a point defect (color center) generation region 13 that absorbs the wavelength of 200 nm. This region 13 is heated by laser beam 14 and delaminated. Since the region of the color centers is an ultraviolet region of 200 nm, a stained part does not remain in the finished product and transparency is kept in the range of the visible light even if a residual ion-injected part stays in the finished product.

Next, a semiconductor device manufacturing method according to a second embodiment of the present invention will be described. This semiconductor device manufacturing method uses the above-described substrate processing method for manufacturing a semiconductor device having a semiconductor layer formed on a substrate. After proton injection, the semiconductor layer is formed on a principal surface of the substrate, and then an irradiation process is performed.

In the present embodiment, a white LED device is taken as an example of a semiconductor device. In manufacturing a white LED device, first protons accelerated with specific acceleration energy (which is selected depending on the thickness of film to be delaminated) are injected into a sapphire substrate that becomes a substrate for GaN so that GaN is made to grow epitaxially on the surface of the substrate on the side of the injection surface. Then, by irradiating the injection surface with an excimer laser from the opposite side to the injection surface of the sapphire substrate, the proton injection layer is separated. Then, by repeating these steps with the same sapphire substrate, sapphire thin film/GaN stacked devices can be produced in large numbers. This results in significant cost reduction owing to short-time processing and efficient use of a sapphire substrate. Further, when protons are injected shallowly from the injection surface such that a rectangular groove of arbitrary width and 1 μm depth is microfabricated, it is possible to manufacture complex IC chip substrates in large numbers and in a short time.

Figure 3:
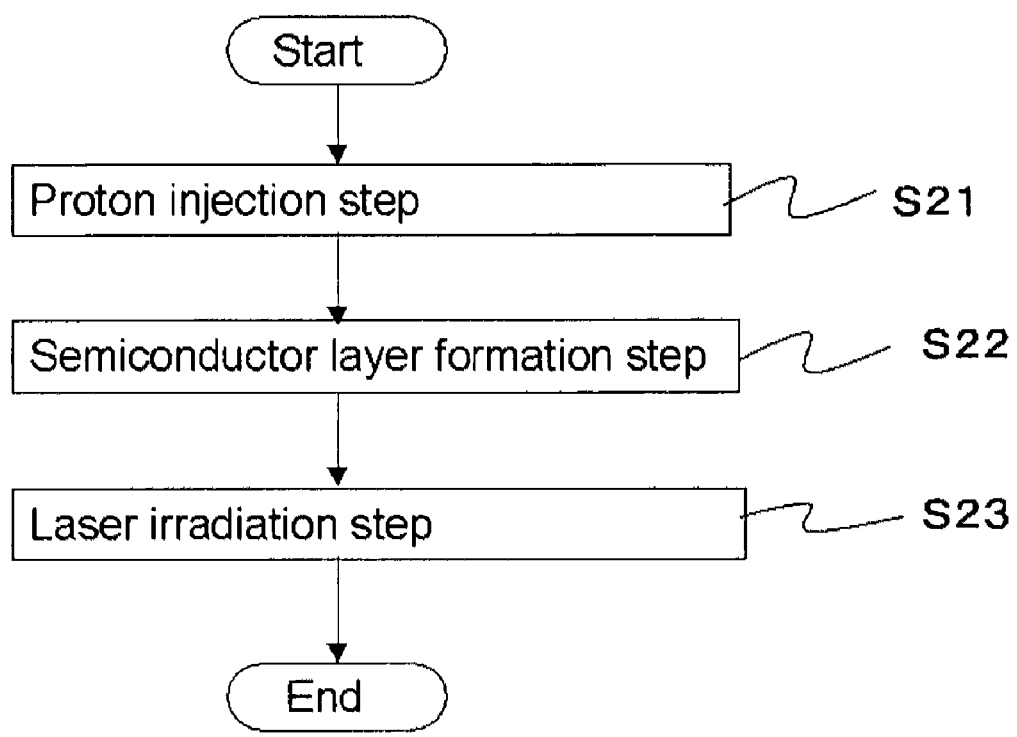
FIG. 3 is a flowchart showing steps of manufacturing a semiconductor device by a semiconductor device manufacturing method according to a second embodiment of the present invention.

FIG. 3 is a flowchart showing steps of manufacturing a semiconductor device by the semiconductor device manufacturing method according to the second embodiment of the present invention. The semiconductor device manufacturing steps comprise a proton injection step (S21), a semiconductor growth step (S22) and the laser irradiation step (S23).

In the proton injection step (S21), a substrate is prepared and protons are injected from one principal surface side of the substrate to form a region where point defects (color centers) have been generated. The semiconductor growth step (S22) forms a semiconductor layer to form a device. In the laser irradiation step (S23), laser beam (which corresponds to the absorption wavelength of the color centers generated by the proton injection) is irradiated, and the color center region is heated to cause delamination at the region.

Figure 4:
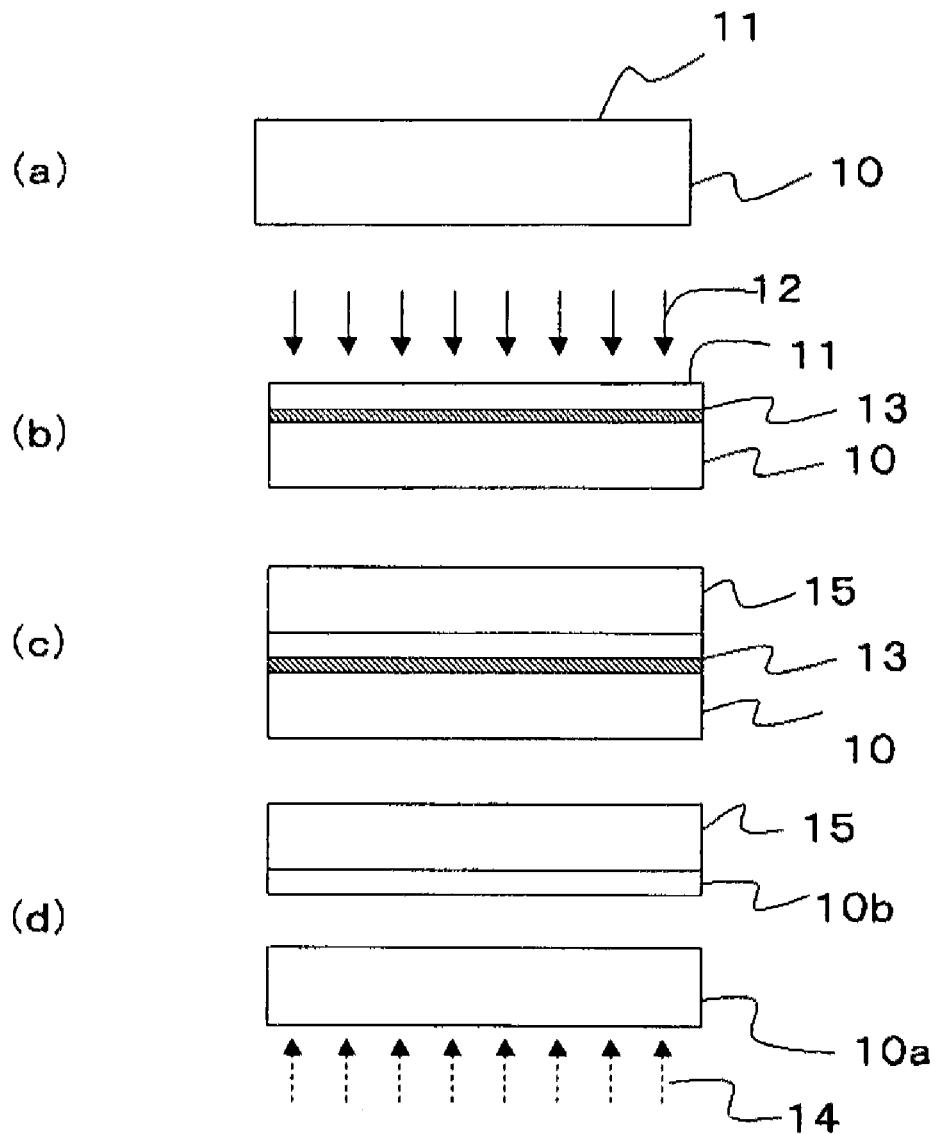
FIG. 4 is a cross section showing a substrate in each step of the semiconductor manufacturing method of the second embodiment.

The semiconductor device manufacturing method is carried out as follows by using a substrate processing method similar to the first embodiment. Here, the same numerals are used to designate the same elements as those in the first embodiment. FIG. 4 is a cross section showing a substrate in each step of the semiconductor device manufacturing method. First, a sapphire substrate 10 is prepared. In FIG. 4(a), the sapphire substrate 10 is a substrate of sapphire (single crystal of aluminum oxide) having a diameter of 2 inches and a thickness of 700 microns, with its front and back sides being mirror surfaces. The plane direction of the front side is a (0001) plane. Next, in FIG. 4(b), protons (H) are injected from one principal surface side 11 by an accelerator or an ion injection system (not shown) (this is shown by the arrow 12 in the figure). This results in formation of a point defect generation region 13.

The sapphire substrate 10 was placed on a specimen platform of the accelerator or ion injection system to perform this proton injection step. To avoid blistering, the injection dose of protons is preferably less than or equal to $1.0*10^{17}$ (ion/cm$^2$), and more preferably more than or equal to $1.0*10^{16}$ (ion/cm$^2$) and less than or equal to $1.0*10^{17}$ (ion/cm$^2$). Further, to reduce damage in the neighborhood of the surface of the sapphire, energy of the proton injection is preferably less than or equal to 10 MeV, and more preferably more than or equal to 0.2 MeV and less than or equal to 10 MeV. The proton injection was performed in a state that the sapphire substrate 10 was tilted at a suitable angle, for example 5°. By injecting protons into the sapphire substrate 10, point defects (color centers), which absorbed ultraviolet of the wavelength of 200 nm, were generated in a laminated state within the sapphire substrate at depths of several μ-several μm from the irradiated surface depending on the injection energy.

Here, as for the injection angle at the time of the proton injection, it is preferable that ions are incident from a plane that is tilted at 2° or more to the (0001) plane in order to prevent deep injection of protons owing to the channeling effect.

In the semiconductor growth step (S22), GaN 15 is made to grow epitaxially on the surface of the substrate on the side of the injection surface, for example.

In the laser irradiation step (S23), for example as shown in FIG. 4(d), laser beam 14 is irradiated from the back side of the sapphire substrate 10. As a result, laser irradiation energy is efficiently absorbed in the point defect generation region 13 generated by the proton injection. Then, the internal temperature of the absorption region rises and the internal pressure of H$_2$ molecules immobilized within the point defects rises, to cause expansion. As a result, internal stress generated in the sapphire owing to the expansion caused by the raise of the internal pressure becomes larger than the mechanical strength of the sapphire itself. Thus, in the case where the depth of the proton injection is shallow (about 1 μm) from the injection surface, this causes delamination by generation of bridging on the irradiated surface in a plane stress condition, and thus it is possible to carry out surface delamination processing along the laser irradiation area. Further, in the case where the proton injection is deep (about several tens μm), it is possible to produce a delaminated film corresponding to the injection depth when a crack extends in the direction of the proton injection surface at the location of the point defects under raised internal pressure in a plane stress condition.

In this laser irradiation step, the proton-injected sapphire substrate 10 is set in a fixture, and this sapphire substrate 10 is irradiated with laser beam of about 200 nm by an ArF (193 nm) excimer laser. As a result, the laser beam is absorbed by the color centers formed by the proton injection; the temperature of the layer of the color centers is raised; hydrogen molecules expand; that area comes to have internal stress and to be delaminated; a groove is formed; and the processing of the sapphire substrate is finished and a sapphire thin film/GaN stacked device is produced.

In this way, it is possible to perform a microfabrication process and a thin film producing process of a sapphire substrate easily, and it is possible to produce a sapphire thin film/GaN stacked device easily. Further, proton irradiation generates color centers that absorb the wavelength of 200 nm. The color centers are heated by laser beam, to cause delamination. Since the color centers form an ultraviolet region of 200 nm, a stained part does not remain in the finished product and transparency is kept in the range of the visible light even if a residual ion-injected part stays in the finished product. Accordingly, an LED that emits light in the visible light range such as blue light can emit light also from the back side of the sapphire without absorption.

Next, experimental results of the substrate processing method described in the above embodiments will be presented.

Figure 8:
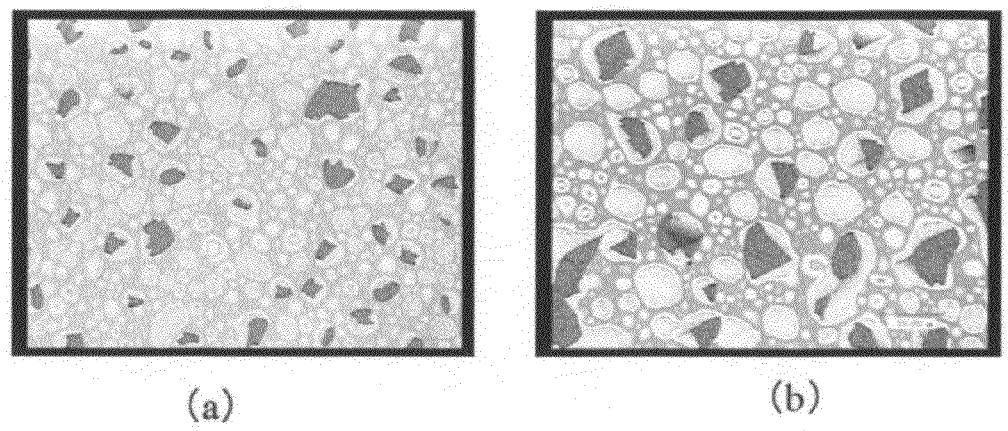
FIG. 8 is microscope images of specimens showing blistering due to proton injection.

FIGS. 5-7 show tables showing injection conditions, doses of protons and states of sapphire after injection in cases where protons were injected into sapphire single crystal with respective injection energies by using two types of accelerators (i.e. an ion injection system and a single-end accelerator). In these tables, a circle mark in the field of "Conditions" indicates a specimen that was sound after injection. And, an x mark indicates a specimen that gave rise to blistering as shown in FIG. 8 after injection. FIG. 8(a) shows blistering observed at the surface of sapphire injected with protons of $2*10^{17}$ (/cm$^2$) at 0.3 MeV parallel with the c-axis of the sapphire, and FIG. 8(b) shows blistering observed at the surface of sapphire injected with protons of $2*10^{17}$ (/cm$^2$) at 0.3 MeV parallel with the a-axis of the sapphire. From these, it was found that a dose for obtaining a sound specimen was less than or equal to $10*10^{17}$ (/cm$^2$), and preferably more than or equal to $1.0*10^{16}$ (/cm$^2$) and less than or equal to $1.0*10^{17}$ (/cm$^2$).

Figure 9:
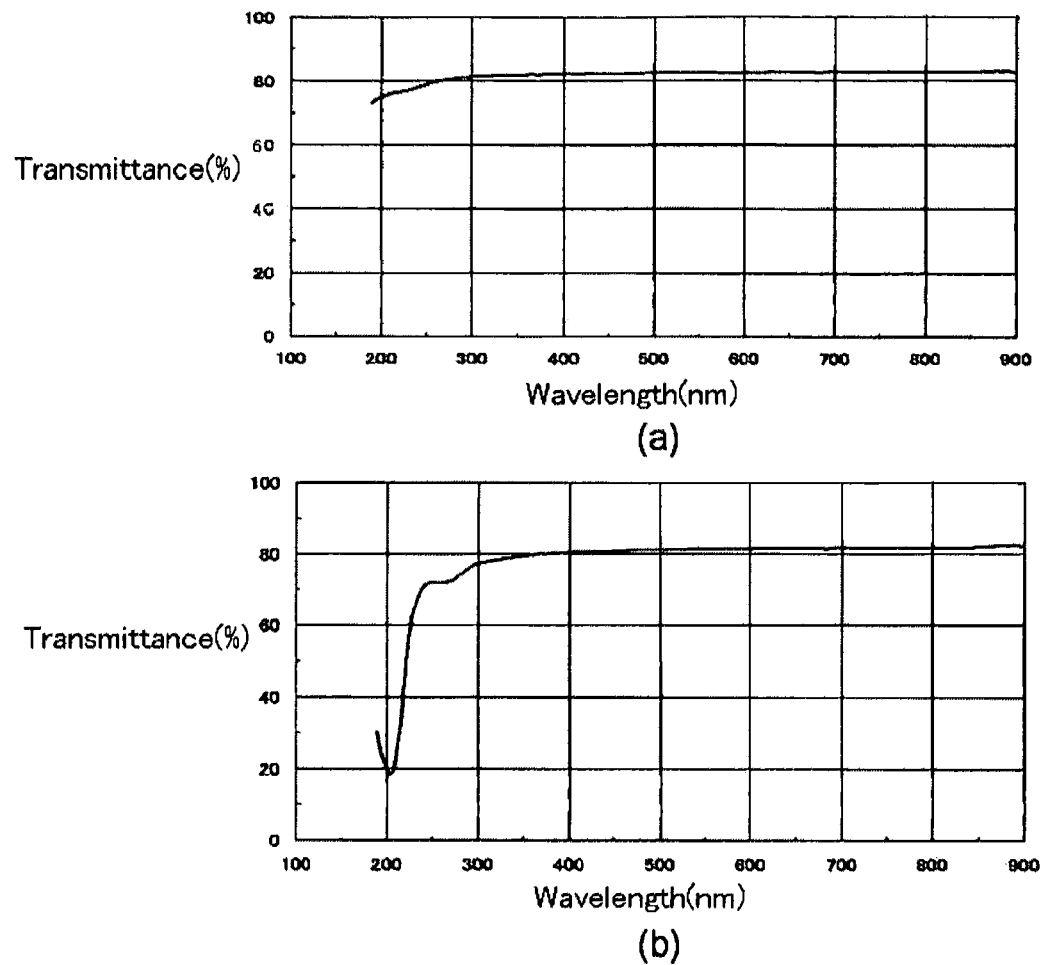
FIG. 9 is a diagram showing absorption spectroscopic characteristics of sapphire before and after proton injection.

FIG. 9 is a diagram showing absorption spectroscopic characteristics of sapphire before and after proton injection. FIG. 9(a) shows absorption spectroscopic characteristic of a specimen that has not been injected with protons, and FIG. 9(b) absorption spectroscopic characteristic of the specimen after proton injection. A test specimen injected with protons has a property that it absorbs ultraviolet of about 200 nm specifically. This results from specific absorption by point defects (color centers) generated in an injection layer of sapphire after injection of protons. From the result shown in FIG. 9(b), it is found that proton-injected sapphire has specific absorption characteristic of the wavelength of 200 nm.

Figure 10:
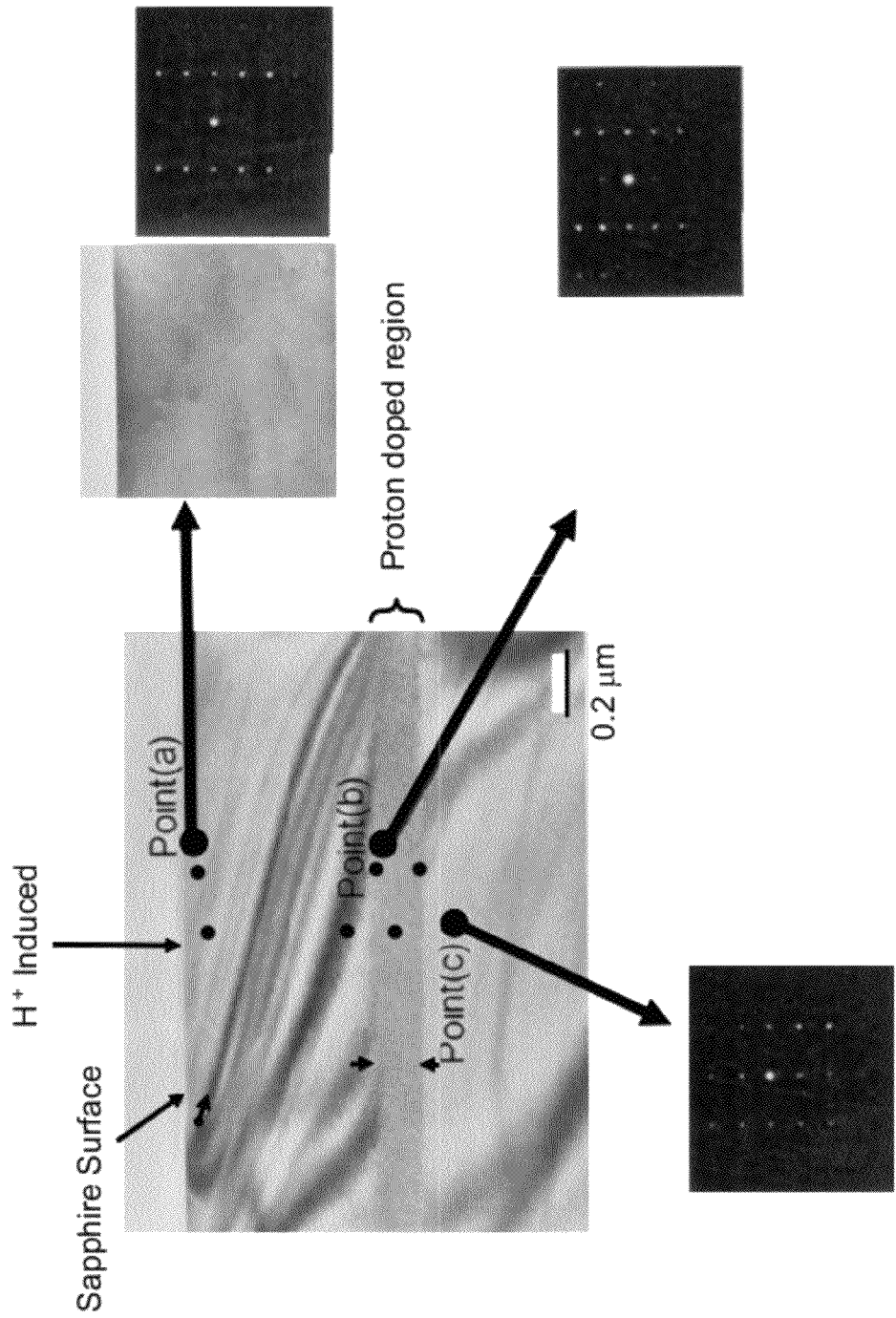
FIG. 10 is a view showing a cross section of proton-injected sapphire.
Figure 11:
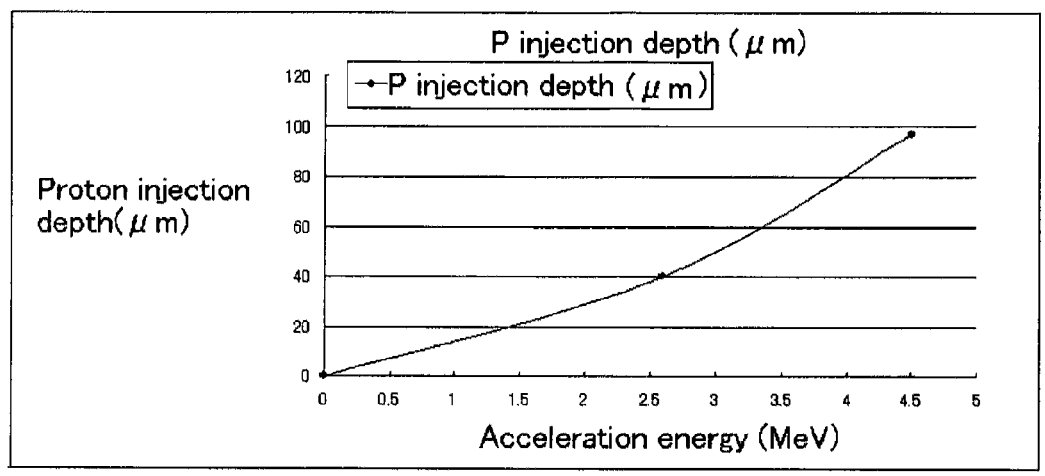
FIG. 11 is a graph showing computationally-obtained energy and depth of protons.

FIG. 10 is a view showing a cross section of proton-injected sapphire. As a result of proton injection of 0.3 MeV, a proton injection layer is observed at a depth of 1 μm from the injection surface. In this region, point defects and injected protons are collected. From observation of FIG. 10 showing the cross section of sapphire after proton injection, it is possible to observe a layer where textural alteration has occurred at a depth of 1 μm corresponding to the calculated injection location of protons accelerated at 0.3 MeV. This region is a point defects generation region formed at the time of proton injection, and it is considered that each point defect is filled with gas of injected protons. Further, FIG. 11 is a graph showing computationally-obtained energy and depth of protons.

Figure 12:
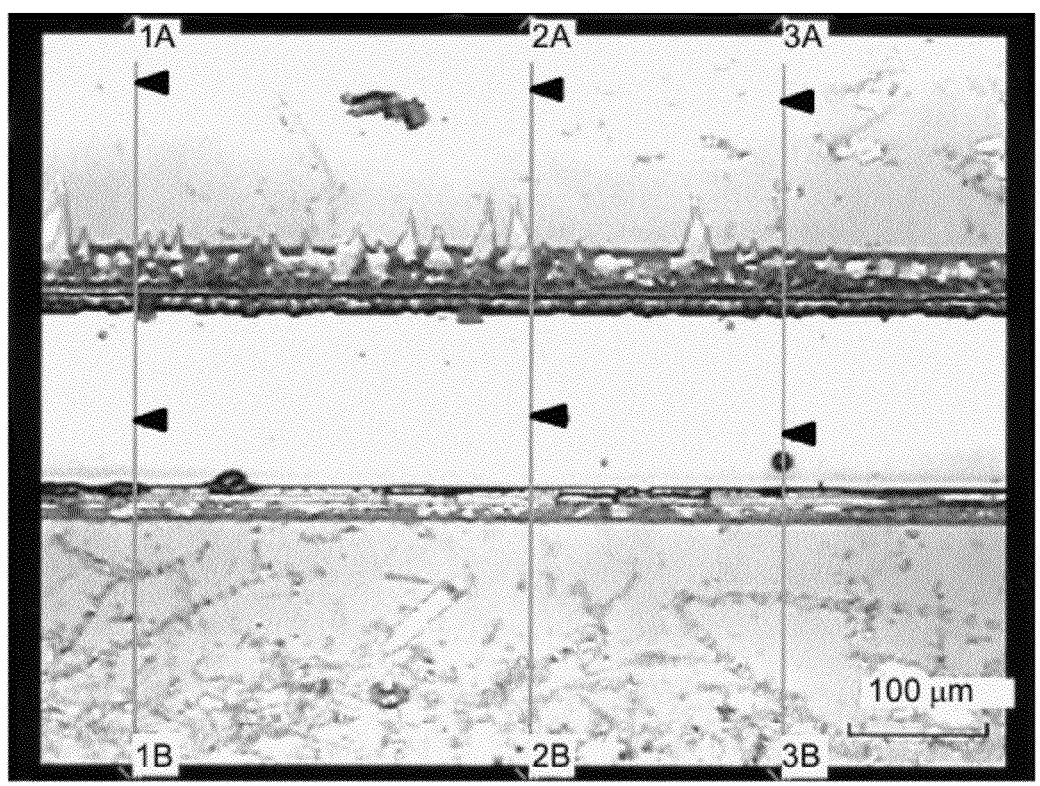
FIG. 12 is a view showing a surface of a sapphire specimen that has been subjected only to laser irradiation (1 Hz*10 minutes)
Figure 13:
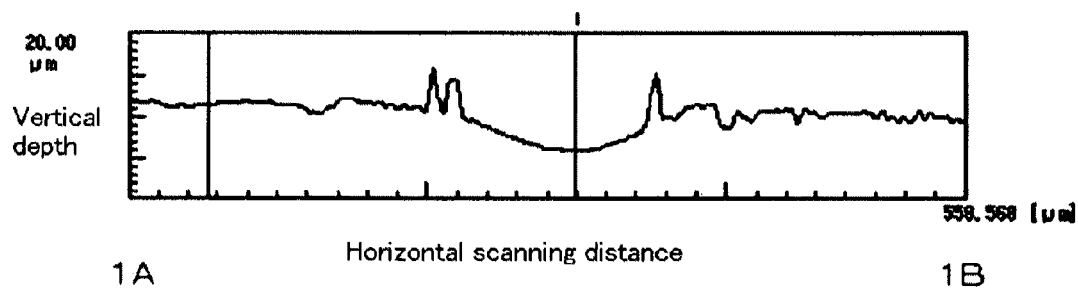
FIG. 13 is a cross section taken along the line 1A-1B of FIG. 12.
Figure 14:
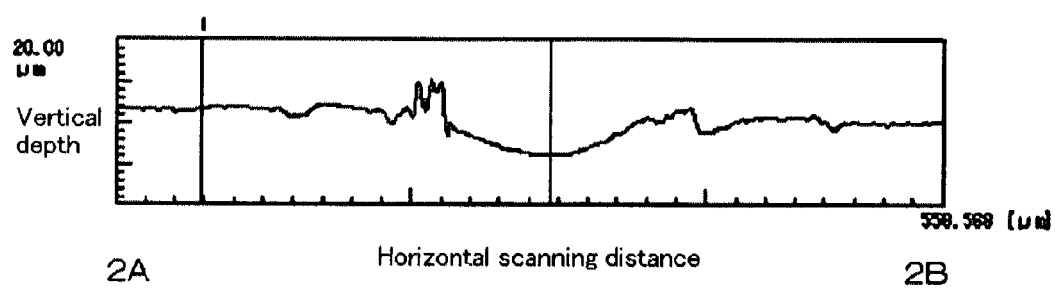
FIG. 14 is a cross section taken along the line 2A-2B of FIG. 12.
Figure 15:
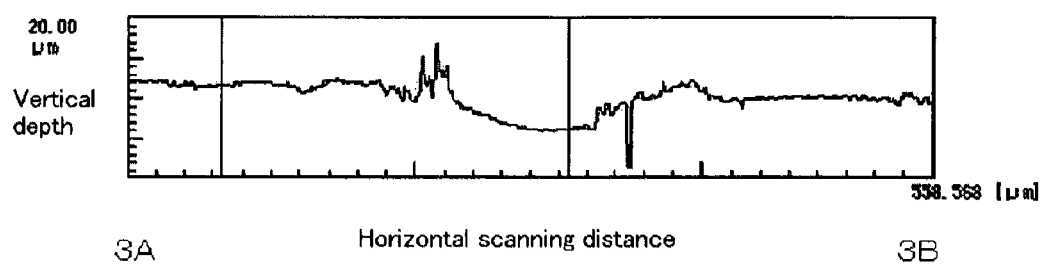
FIG. 15 is a cross section taken along the line 3A-3B of FIG. 12.

FIG. 12 is a view showing a surface of a sapphire specimen that has been subjected only to laser irradiation (1 Hz*10 minutes). The figure shows generation of a recess having a crater shape. This is a result of observation of a surface of sapphire irradiated by an ArF excimer laser of 200 nm. FIG. 13 is a cross section taken along the line 1A-1B of FIG. 12, and this cross section was obtained by scanning with a surface roughness meter. FIG. 14 is a cross section taken along the line 2A-2B of FIG. 12. And, FIG. 15 is a cross section taken along the line 3A-3B of FIG. 12. Since the surface showed no change after one shot of laser irradiation, repeated irradiation (1 Hz*10 minutes) was performed and resultant ablation trace of a crater shape has been observed.

Figure 16:
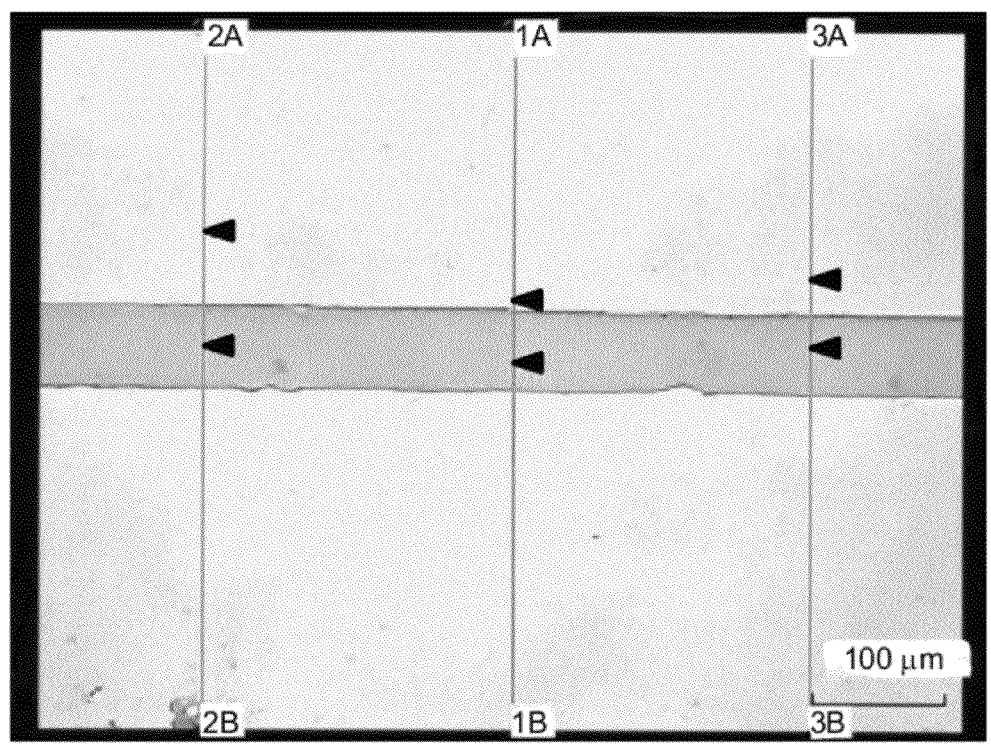
FIG. 16 is a view showing a surface (a proton-injected side) of a sapphire specimen that has been subjected to injection of $H_2^+$ of 0.3 MeV and thereafter one shot of laser irradiation.
Figure 17:
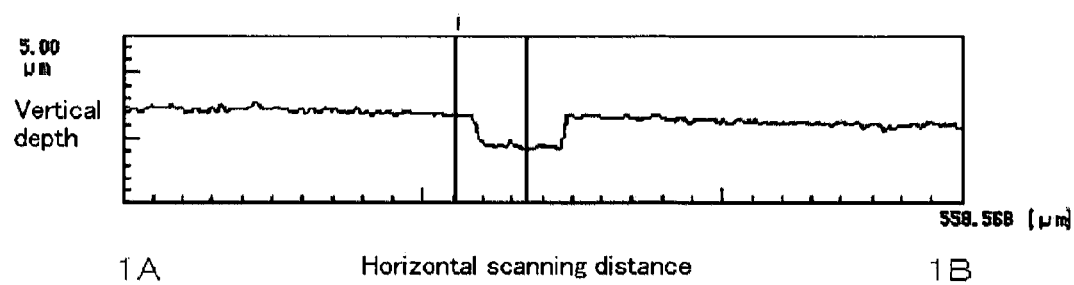
FIG. 17 is a cross section taken along the line 1A-1B of FIG. 16.
Figure 18:
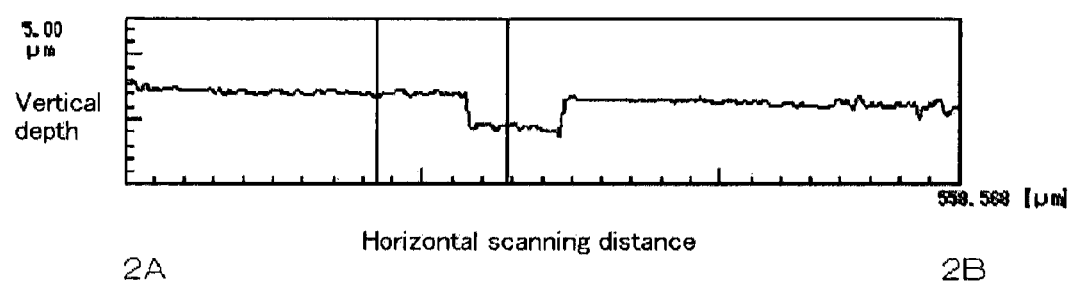
FIG. 18 is a cross section taken along the line 2A-2B of FIG. 16.
Figure 19:
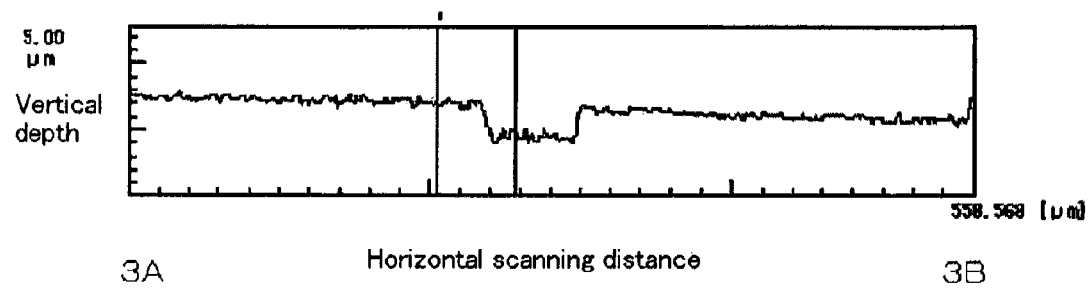
FIG. 19 is a cross section taken along the line 3A-3B of FIG. 16.

FIG. 16 is a view showing a surface (a proton-injected side) of a sapphire specimen that has been subjected to injection of $H_2^+$ of 0.3 MeV and thereafter one shot of ArF excimer laser of 200 nm. It is seen that a recess of a rectangular shape of 1 μm in depth has appeared in the irradiation surface. From this result, it is considered that, in proton injected sapphire, point defects generated at the time of proton injection absorbed laser of a characteristic wavelength selectively and it made $H_2$ gas accumulated within the defects to be heated and expanded to cause delamination on the injection surface side. FIG. 17 is a cross section taken along the line 1A-1B of FIG. 16. FIG. 18 is a cross section taken along the line 2A-2B of FIG. 16. And, FIG. 19 is a cross section taken along the line 3A-3B of FIG. 16. In the case of the sapphire of FIG. 12, one shot irradiation did not cause a change in its surface. In the case of proton-injected sapphire, however, it is found that a groove of a rectangular shape was generated to have a depth of 1 μm in the surface of the proton-injected sapphire. This shows that point defects absorbed specifically the most part of energy of one shot of irradiation to make $H_2$ gas within the defects to be heated and expanded and as a result surface delamination occurred only in the laser-irradiated region of the proton-accumulated region. Further, it was found that there was no difference in groove generation between the a-axis and the c-axis of sapphire, and thus groove generation did not depend on the direction of crystal axis.

From the above experiments, it is concluded that a fine rectangular groove of an arbitrary depth can be formed in a surface of sapphire by selecting energy of proton injection to adjust depth of proton injection and adjusting width of laser beam. Further, when the injection depth is larger and thus a plane stress state is realized in the neighborhood of point defects, laser irradiation of the point defects can generate a crack extending parallel with the proton injection surface so that a thin film is produced.

From the above experimental results, it is possible to conclude the following.

(1) As proton injection conditions for sapphire, the following conditions are recommended.

(A) Acceleration energy: 0.3-3 MeV; (B) Test temperature at injection: less than or equal to 573 K; and (C) less than or equal to $1*10^{17}/cm2$ (in $H^+$ equivalent).

(2) There is no difference dependent on crystallographic orientation of sapphire in the extent of damage at the time of proton injection.

(3) In the case of a specimen injected with protons accelerated at 0.3 MeV, textual alteration of thickness of about 200 nm occurs in the proton-injected region at a depth of about 1 μm. However, there is no crystallographic difference from a non-irradiated region of sapphire single crystal.

(4) In the case of a proton injection test of a specimen immersed in liquid nitrogen, it was impossible to notice a prominent change such as delamination, damage and the like.

(5) In the case of a sapphire specimen, prominent ultraviolet absorption was not observed in the wavelength range of 200-900 nm. On the other hand, a proton-injected sapphire specimen has a characteristic of absorbing ultraviolet of about 200 nm specifically.

(6) In the case where a sapphire specimen was irradiated by an ArF excimer laser that generated wavelength of about 200 nm repeatedly at 3.4 J/cm$^2$ and 1-50 Hz, its damage depth increased in proportion to the repeated time. In the case of 50 Hz*10 min, a V-shaped groove reaching to a depth of 30-60 μm was formed. Based on the relation between input energy and processing depth, it is estimated that input energy required for causing damage within a sapphire specimen is about 100 J/cm$^2$.

(7) In the case where single pulse laser irradiation was carried out at low energy of 3.4 J/cm$^2$ by the same laser as above on a specimen injected with protons at 0.3 MeVH$^{+}*1.3*10^{17}$ ions/cm$^2$, a groove of a rectangular shape having depth of 1 μm and width of 50-80 μm was generated from the location corresponding to the textural alteration region observed in the above (3). Such a groove is not formed by laser irradiation at such a low energy of 3.4 J/cm$^2$. When this was repeated under the same conditions, it was found that the width of the rectangular increased along the proton injection surface.

(8) When proton injection was carried out with adjusted acceleration energy and injection dose of protons to form a proton-injected layer of a specific thickness at an arbitrary depth in the inside of sapphire, it became possible to carry out microfabrication such that laser incident energy from the outside was focused on that location so as to cut the location. When the proton injection surface and the laser irradiation surface are made larger, it is also possible to produce a large area sapphire thin film from a sapphire substrate The structure, shapes, sizes and layout relations described in the above embodiments have been described only in outline to such a degree that the present invention can be understood and carried out. Further, the numerical values, the composition (material) of each element, and the like are only examples. So the present invention is not limited to the described embodiments, and these embodiments can be modified and changed variously without departing from the spirit and scope of the invention defined in the claims.

The substrate processing method and the semiconductor device manufacturing method of the present invention can be applied to methods using a substrate of alumina oxide single crystal (such as sapphire) that is an insulator and has outstanding heat resistance and transmittance, such as methods of manufacturing LED optical devices (sapphire substrate/GaN/Ce laminated LED devices), semiconductor devices (semiconductor substrates), and low-expansion sapphire intercalation materials for joining different kinds of materials.

The invention claimed is:

1. A substrate micro-processing method for forming a micro-groove on a targeted substrate area made of sapphire, comprising:

a proton injection step, in which protons are injected from one principal surface side of the substrate; and an irradiation step, in which the substrate is irradiated by an ArF excimer laser locally in an overlapping region which overlaps at least with a region where the protons were injected, in order to form the micro-groove by dividing the substrate in the overlapping region locally.

2. A substrate micro-processing method of claim 1, wherein:

a proton dose in the proton injection step is more than or equal to $1.0 \times 10^{16}$ (/cm$^2$) and less than or equal to $1.0 \times 10^{17}$ (/cm$^2$).

3. A substrate micro-processing method of claim 1, wherein:

energy of proton injection in the proton injection step is more than or equal to 0.2 MeV and less than or equal to 10 MeV.

4. A substrate micro-processing method of claim 2, wherein:

energy of proton injection in the proton injection step is more than or equal to 0.2 MeV and less than or equal to 10 MeV.

5. A semiconductor manufacturing method, wherein:

the method uses a substrate micro-processing method for forming a micro-groove on a targeted substrate area made of sapphire, comprising:

a proton injection step, in which protons are injected from one principal surface side of the substrate; and an irradiation step, in which the substrate is irradiated by an ArF excimer laser locally in an overlapping region which overlaps at least with a region where the protons were injected, in order to form the micro-groove by dividing the substrate in the overlapping region locally; and the semiconductor layer is formed on a principal surface of the substrate after the proton injection step, and thereafter the irradiation step is carried out.

* * * * *